US012575038B2

(12) United States Patent
Oliva

(10) Patent No.: US 12,575,038 B2
(45) Date of Patent: Mar. 10, 2026

(54) VEHICLE CAMERA MODULE AND METHOD OF ASSEMBLY

(71) Applicant: Ficosa Adas, S.L.U., Barcelona (ES)

(72) Inventor: Daniel Alonso Oliva, Barcelona (ES)

(73) Assignee: FICOSA ADAS, S.L.U., Barcelona (ES)

( * ) Notice: Subject to any disclaimer, the term of this patent is extended or adjusted under 35 U.S.C. 154(b) by 172 days.

(21) Appl. No.: 18/201,500

(22) Filed: May 24, 2023

(65) Prior Publication Data

US 2023/0397347 A1 Dec. 7, 2023

(30) Foreign Application Priority Data

Jun. 1, 2022 (EP) ..................................... 22382530

(51) Int. Cl.
| | |
|---|---|
| *H05K 5/00* | (2025.01) |
| *G03B 17/02* | (2021.01) |
| *G03B 30/00* | (2021.01) |
| *H01R 13/504* | (2006.01) |
| *H04N 23/51* | (2023.01) |
| *H04N 23/57* | (2023.01) |
| *H05K 5/06* | (2006.01) |

(52) U.S. Cl.
CPC ............ *H05K 5/006* (2013.01); *G03B 17/02* (2013.01); *G03B 30/00* (2021.01); *H01R 13/504* (2013.01); *H04N 23/51* (2023.01); *H04N 23/57* (2023.01); *H05K 5/066* (2013.01)

(58) Field of Classification Search
CPC ........ H05K 5/006; H05K 5/066; G03B 30/00;

G03B 17/02; G03B 2217/002; H04N 23/51; H04N 23/57; H01R 13/504; B60R 11/04; H10F 39/804; Y10T 29/49002
See application file for complete search history.

(56) References Cited

U.S. PATENT DOCUMENTS

| | | | | |
|---|---|---|---|---|
| 7,595,943 B2 * | 9/2009 | Yuan | ...................... | G02B 7/028 |
| | | | | 359/820 |
| 7,679,156 B2 * | 3/2010 | Bogdan | .................. | H10F 77/50 |
| | | | | 257/E31.127 |
| 7,965,336 B2 * | 6/2011 | Bingle | .................. | B60S 1/0411 |
| | | | | 348/149 |
| 8,542,451 B2 * | 9/2013 | Lu | ...................... | G02B 27/0025 |
| | | | | 359/819 |
| 8,994,878 B2 * | 3/2015 | Byrne | .................... | H04N 23/51 |
| | | | | 348/148 |

(Continued)

FOREIGN PATENT DOCUMENTS

| | | | | | |
|---|---|---|---|---|---|
| EP | | 3816723 A1 * | 5/2021 | ............. | B60R 11/04 |
| WO | 2006136208 A1 | | 12/2006 | | |

OTHER PUBLICATIONS

European Search Report dated Nov. 18, 2022 for European Patent Application No. 22382530.8, 9 pages.

*Primary Examiner* — Rockshana D Chowdhury
*Assistant Examiner* — Martin Antonio Asmat Uceda
(74) *Attorney, Agent, or Firm* — Brooks Kushman P.C.

(57) ABSTRACT

The electronic device comprises a housing assembly extending along a longitudinal axis and comprising a first housing part and a second housing part configured to be joined to each other through an overlap welding, and an electronics carrier received within an inner space of the housing assembly defined when the first and second housing parts are joined to each other.

17 Claims, 2 Drawing Sheets

(56) References Cited

U.S. PATENT DOCUMENTS

| | | | | |
|---|---|---|---|---|
| 9,572,273 | B2 * | 2/2017 | Blunier | A61B 1/0661 |
| 9,674,410 | B2 * | 6/2017 | Uchiyama | H04N 23/57 |
| 10,349,515 | B2 * | 7/2019 | Scheja | H04N 23/54 |
| 10,477,083 | B2 * | 11/2019 | Mleczko | H04N 23/57 |
| 10,841,470 | B2 * | 11/2020 | Sung | G03B 17/12 |
| 10,996,544 | B2 * | 5/2021 | Alonso Oliva | G03B 17/08 |
| 11,303,785 | B2 * | 4/2022 | Park | H04N 23/52 |
| 11,407,364 | B2 * | 8/2022 | Kim | H04N 23/51 |
| 11,683,911 | B2 * | 6/2023 | Wöhlte | G01S 7/4813 |
| | | | | 361/720 |
| 12,174,448 | B2 * | 12/2024 | Skrocki | G02B 7/025 |
| 12,187,200 | B2 * | 1/2025 | Garcia | G03B 17/02 |
| 12,346,005 | B2 * | 7/2025 | Young | G03B 17/02 |
| 2014/0036084 | A1 | 2/2014 | Yuesheng et al. | |
| 2014/0132768 | A1 * | 5/2014 | Choi | G03B 17/08 |
| | | | | 348/148 |
| 2016/0191863 | A1 * | 6/2016 | Minikey, Jr. | H04N 23/57 |
| | | | | 348/148 |
| 2019/0208091 | A1 | 7/2019 | Mleczko et al. | |
| 2020/0333619 | A1 * | 10/2020 | Ang | B60R 11/04 |
| 2021/0323485 | A1 | 10/2021 | Kim et al. | |
| 2022/0159159 | A1 | 5/2022 | Byrne et al. | |
| 2023/0122739 | A1 * | 4/2023 | Abad Garcia | G02B 7/028 |
| | | | | 348/340 |

* cited by examiner

FIG. 3
FIG. 4
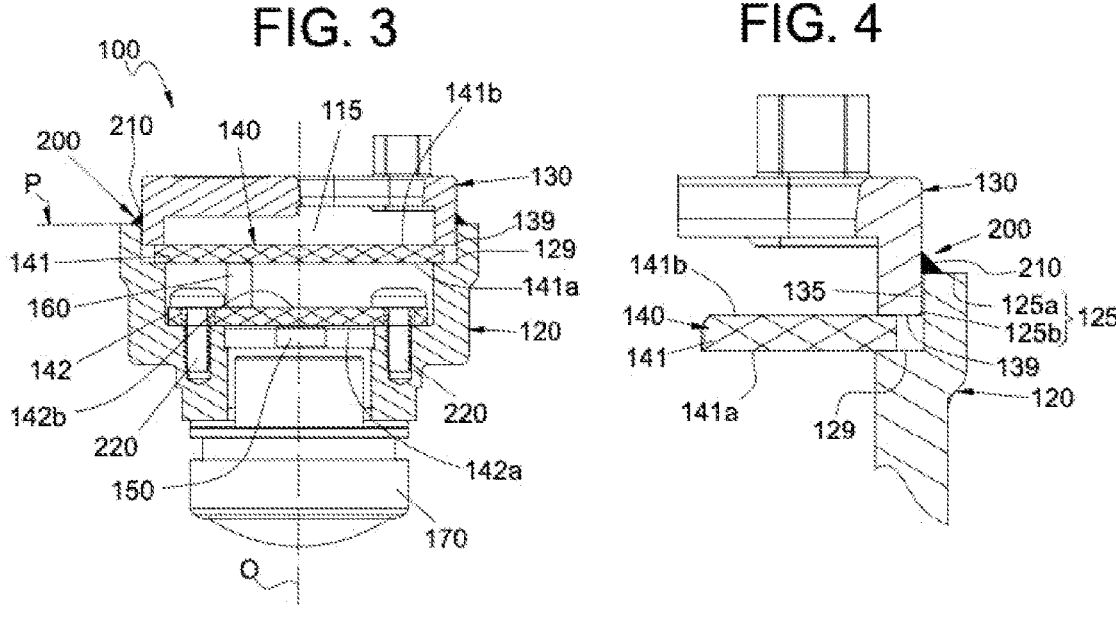
FIG. 5
FIG. 6
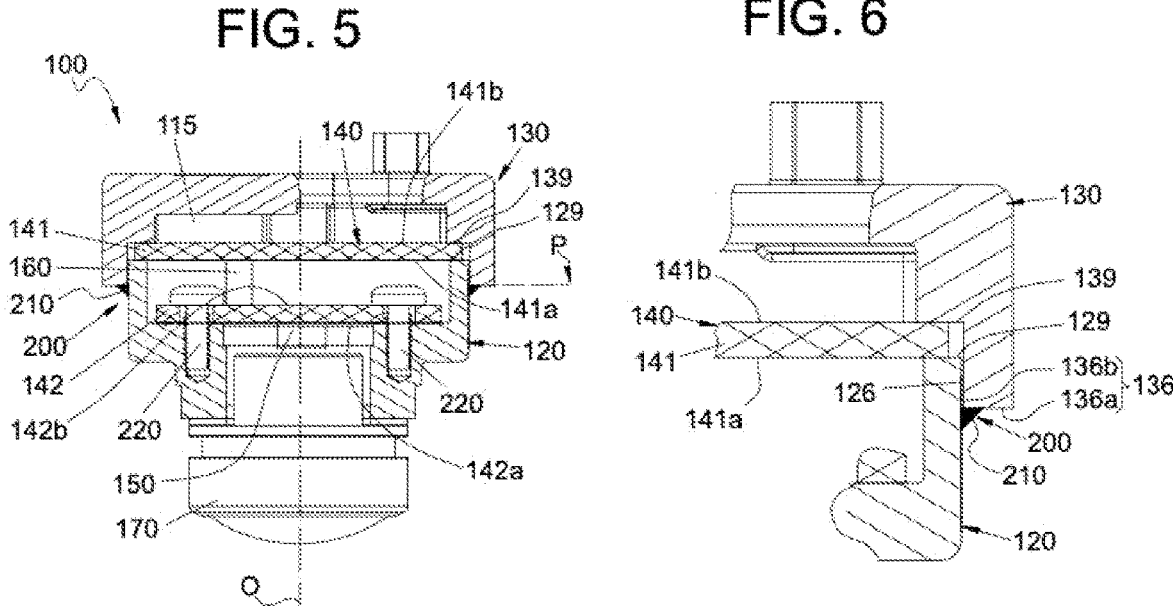

VEHICLE CAMERA MODULE AND METHOD OF ASSEMBLY

CROSS-REFERENCE TO RELATED APPLICATIONS

This application claims priority to EP application Serial No. 22382530.8 filed Jun. 1, 2022, the disclosure of which is hereby incorporated in its entirety by reference herein.

TECHNICAL FIELD

The present disclosure relates to electronic devices such as, but not limited to, vehicle camera devices comprising a housing assembly within which at least an electronics carrier is received.

BACKGROUND

Electronic devices, for example, camera modules for motor vehicles, comprising a housing assembly formed of two or more housing parts, are known in the automotive sector. In use, when joined to each other, the housing parts define together an inner space where electronics components, such as an electronics carrier, a camera lens, at least one image sensor, etc. are suitably received.

The housing assembly extends along a longitudinal axis. The housing assembly usually comprise a first housing part, also referred to as front housing, and a second housing part, also referred to as back housing. Both the first housing part and the second housing part may be alternatively referred to as side housing parts when joined to each other side by side with respect to the longitudinal axis of the housing assembly. In any case, the front housing, the back housing, and the side housings in prior art devices have been generally made of plastics.

The first housing part and the second housing part are usually joined together via fasteners, for example, screws. However, attachment of the first housing part and the second housing part through screws is time consuming and involves complex assembly operations.

When it comes to camera modules, for example, for vehicle camera devices, the camera modules typically include parts, such as control units, configured to operate, for example, as an image processing system, which are increasingly powerful. As a result, large amounts of heat are generated inside the housing assembly. In order to dissipate heat as quickly as possible to the outside of the housing assembly, housing parts made of plastics have been more recently replaced with housing parts made of metal. Furthermore, the image sensor is coupled to the electronics carrier. In order to ensure good image quality, the first housing part and the second housing should be joined together such that the camera lens and the image sensor are optically aligned with respect to each other. It is desired that the camera lens and the image sensor remain both optically aligned over the service life of the camera module such that optical communication is not lost.

The electronics carrier may include, for example, one or more printed circuit boards (PCB). In use, the electronics carrier is fitted within the inner space defined by the housing parts when joined together. Usually, the electronics carrier is mechanically fixed to the front housing by via fasteners, for example, screws passing through the material of the electronics carrier as disclosed, for example, in WO2006136208 A1 and US20140036084 A1. The use of screws to attach the electronics carrier and the housing assembly has been found to be undesirable as it is complex and time consuming in assembly operations.

EP3816723, filed by the applicant of the present application, provides, among other things, alternative mechanisms for coupling the electronics carrier to the housing assembly. Specifically, the first housing part and the second housing part are coupled together such that the first housing part contacts at least one portion of a first surface of the electronics carrier and the second housing part contacts at least one portion of a second surface of the electronics carrier. In particular, the electronics carrier is sandwiched between the first and second housing parts. Therefore, a clamping pressure may be advantageously applied on the electronics carrier in order to prevent it from being moved as it is fitted to the housing assembly. It has been shown to be advantageous since no screws are required for attaching the electronics carrier to the front housing (i.e., screwless camera assembly) and assembling processes can be therefore speeded up.

However, it has been found that, an over pressure may disadvantageously appear on the electronics carrier due to manufacturing tolerances of the first housing part, the second housing part, and the electronics carrier. In particular, contact between the contact portions of the housing parts and the electronics carrier may be lost and/or the electronics carrier may become damaged when attaching the first housing part to the second housing part through screws while the electronics carrier is sandwiched between the first and second housing parts. For example, if the measured thickness of the electronics carrier is less than the expected nominal thickness, the electronics carrier may end up being moved. This is, contact of housing parts on the electronics carrier may be lost. Conversely, if the measured thickness of the electronics carrier exceeds the expected nominal thickness may result in a bending moment that may lead to an opposite side of the housing part to be lifted up. This may cause undesirable overpressure on the electronics carrier, in particular at edge portions thereof. Therefore, the electronics carrier may become damaged.

Attachment of the first housing part and the second housing part has been alternatively performed through welding, as disclosed, for example, in US20220159159. This document refers to a vehicular camera module wherein the rear housing part is joined to the front housing part by butt welding. Butt welding is formed simply by placing two pieces of metal end-to-end and then welding along the join. In a butt joint, the surfaces of the workpieces being joined are on the same plane and weld metal remains within the planes of the surfaces.

Despite the above, a need still remains for electronic devices, and more particularly camera modules, for example, for vehicle camera devices, in which attachment of housing parts is properly ensured during use while preventing damages to electronics components within the housing assembly and without increasing costs.

Throughout the present description, in use refers to a condition of the electronic device, such as a camera module, for example, for a vehicle camera device, in which the device is ready for operation, with the first housing part and the second housing part joined to each other.

SUMMARY

The present disclosure relates to an electronic device, such as, but not limited to, camera modules, for example, for vehicle camera devices. A method for assembling the electronic device is also disclosed herein.

The present electronic device comprises a housing assembly extending along a longitudinal axis. The housing assembly comprises a first housing part, also referred herein to as front housing, and a second housing part, also referred herein to as back housing. The housing assembly may be made of an electrically conductive material. More preferably, at least one of the first and second housing parts of the housing assembly may be made of metal, in particular, comprising at least aluminum. Other materials or combinations thereof are possible. The first and second housing parts may be made of the same or different materials.

The first and second housing parts are configured to be joined to each other defining an inner space therein. An electronics carrier is received within the inner space of the housing assembly. In particular, the electronics carrier is tightly sandwiched in the inner space when in use. For example, the first and second housing parts may be configured such that when they are joined to each other, the second housing part contacts at least one portion of the electronics carrier.

The electronics carrier may comprise at least one printed circuit board. The electronics carrier has first and second opposed parallel surfaces preferably arranged substantially perpendicular to the longitudinal axis of the housing assembly.

Sandwiching of the electronics carrier may be caused by an interference fit of the first housing part and the second housing part with the electronics carrier arranged there between.

However, sandwiching of the electronics carrier may alternatively be caused by an interference fit of the electronics carrier arranged between the second housing part and another part such as, for example, an electronics connecting device. The electronics connecting mechanism may be, for example, a board-to-board connector for electrically connecting different printed circuit boards. It is therefore not essential for the electronics carrier to be sandwiched between the first housing part and the second housing part, but the electronics carrier could in some cases be sandwiched, as described above, between an element that is not part of the housing assembly such as, for example, the board-to-board connector, if provided.

At least one of the electronics carrier, the first housing part, and second housing part may optionally include an elastic mechanism. The elastic mechanism may comprise a metallic spring, a rubber gasket, or a paste-like gap filler. The elastic mechanism is arranged in pressure contact with the electronics carrier for performing attachment through a sandwiching effect as mentioned above. The elastic mechanism is deformable in nature under external pressure. Thus, the elastic mechanism may be any element that comprises an elastic material or an elastic structure capable of being deformed. Damages to the electronics carrier from overpressure or over-compression with manufacturing tolerances of the different parts are thus prevented or at least partially reduced.

Attachment of the first and second housing parts together is carried out through an attaching mechanism. The attaching mechanism comprises an overlap welding. The overlap welding may be formed by laser welding, that is, with no filler material. However, if required, the overlap welding could be formed by supplying a suitable filler material. It is preferred the overlap welding causes the first and second housing parts to be sealingly joined together.

The overlap welding may be defined within the present disclosure as a weld for joining at least a portion of first housing part and a portion of the second housing part that are overlapped on top of one another according to a direction perpendicular to the longitudinal axis with at least a portion of weld material being arranged on an outer surface of the housing assembly.

The above configuration of the present electronic device with a first housing part and a second housing part joined to each other through overlap welding, with an electronics carrier arranged sandwiched within the housing assembly, results in that parts can be assembled efficiently and quickly without adversely affecting good performance and with optical alignment of parts being properly ensured. A gap is not created in the longitudinal direction in the interface surface between the first and second housing parts. The interface surface may be defined at a location where the first and second housing parts are attached to each other. Further, there is no need for screws, glue or other similar mechanism for joining the housing parts and the electronics carrier and therefore the assembly time is advantageously reduced.

The overlap welding may be applied on at least a portion or on the entire outer perimeter section of the housing parts. In particular, the overlap welding may be applied around the longitudinal axis of the housing assembly in a manner of ensuring that the first and second housing parts are properly joined to each other.

In a first example, the overlap welding may be arranged on an outer side surface of the second housing part and at least one of an end surface and a side surface of the first housing part. More specifically, according to the first example, the above-mentioned interface surface may be defined in an outer surface of the second housing part and an inner side surface and/or an end surface of the first housing part.

Inner and outer surfaces may be defined within the present disclosure as surfaces facing the interior and the exterior, respectively, of the first housing part or the second housing part.

Also, within the meaning of the present disclosure, a side surface refers to a longitudinal surface of the first housing part or the second housing part that connects opposite ends of the housing assembly along a longitudinal direction.

Also, within the meaning of the present disclosure, an end surface refers to a surface of the first housing part or the second housing part at least perpendicular or at least substantially angled to the longitudinal axis of the housing assembly, such as, for example, at least substantially parallel to a top or bottom surface of the housing assembly.

In a second example, the overlap welding may be arranged on an outer side surface of the first housing part and at least one of an end surface or an inner side surface of the second housing part. More specifically, according to the second example, the above-mentioned interface surface may be defined in an outer surface of the first housing part and an inner side surface and/or an end surface of the second housing part.

Attachment of the first and second housing parts according to both examples described above through overlap welding has been found to advantageously result in damages to the electronics carrier being at least reduced or even avoided.

In use, the first and second housing parts may abut each other defining the above-mentioned interface surface there between. In this case, the overlap welding may extend along the interface surface that is defined in the first and second housing parts when they are joined to each other.

However, there may be cases where a gap is defined between the first and second housing parts. In particular, a gap may be defined between a side surface of the first housing part and an outer surface of the second housing part; or between an inner side surface of the second housing part and an outer surface of the first housing part. More in particular, a gap may be formed between one or more sidewalls of the first housing part and one or more sidewalls of the second housing part such that the first and second housing parts are sealingly joined together. Thus, the overlap welding is preferably provided in the gap and, more specifically, the attaching mechanism at least partially, but preferably totally, fills the gap, when in use. The above-mentioned interface surface is in this case defined by the overlap welding.

In any event, it is preferred that the overlap welding is contained in a plane arranged substantially perpendicular to the longitudinal axis of the housing assembly. Such arrangement ensures that no gap is created in the longitudinal direction between the first and second housing parts which facilitates joining the parts by weld.

When it comes to camera modules, for example, for vehicle camera devices, the present electronic device may comprise a camera lens assembly. In this case, the camera lens assembly is arranged extending along the longitudinal axis of the housing assembly. In this particular case, the longitudinal axis defines or is parallel to an optical axis of the camera lens assembly. In use, the camera lens assembly is in communication with an image sensor that is coupled to the electronics carrier so as to acquire a captured image.

More specifically, in the example of application to camera modules, for example, for vehicle camera devices, the electronics carrier may comprise a first printed circuit board and a second printed circuit board. The first and second printed circuit boards are arranged spaced apart along the above-mentioned optical axis, preferably parallel to each other. The first and second printed circuit boards are electrically connected to each other by the electronics connecting mechanism. The image sensor is coupled to at least one of the first and second printed circuit boards with the first and second housing parts arranged respectively abutting different portions of the first printed circuit board. In use, the first printed circuit board may be arranged sandwiched between the first and second housing parts through an interference fit as already described above.

In the above particular example of application to camera modules, in use, the first housing part preferably contacts at least one portion of the first surface of the electronics carrier and the second housing part contacts at least one portion of a second surface of the electronics carrier. The image sensor is coupled to the first surface of the second printed circuit board. The second surface of the electronics carrier is arranged further away from the lens assembly than the first surface of the electronics carrier. The first surface of the electronics carrier is arranged closer to the image sensor than the second surface of the electronics carrier. In general, in use, the first printed circuit board is arranged further away from the lens assembly than the second printed circuit board.

The first housing part extends longitudinally from a first end to a second end according to the longitudinal axis. Further, the first housing part comprises an outer surface, a bottom surface disposed at or near the second end, one or more sidewalls including an inner surface, and, in use, a space being formed in an interior of the first housing part when the first and second housing parts are joined to each other. The lens assembly is at least partially disposed in the space formed in the interior of the first housing part at or near the first end.

The second housing part extends longitudinally from a first end to a second end according to the longitudinal axis. Further, the second housing part comprises an outer surface, a front surface disposed at or near the first end, one or more sidewalls including an inner surface and, in use, a space being formed in an interior of the second housing part when the first and second housing parts are joined to each other.

At least one of the first housing part and the second housing part may be provided with protrusions extending along the direction of the longitudinal axis or parallel thereto, or perpendicular to the first and second surfaces of the electronics carrier. Each protrusion may comprise a contact portion that may preferably be thermal and/or electrical conductors.

In use, each contact portion may provide a contact pressure applied to corresponding first and second surfaces of the electronics carrier. The contact pressure may provide a force component substantially perpendicular to the first or second surfaces of the electronics carrier. The contact portion may comprise the above-mentioned elastic mechanism. It may be preferred that the first and second housing parts are configured to be joined to each other by the above-mentioned overlap welding, being the electronics carrier with an interference fit with the first and second housing parts. For this purpose, the overlap welding is adapted to keep the electronics carrier tightly clamped in the direction parallel to the longitudinal axis, or perpendicular to the first and second surfaces of the electronics carrier. The overlap welding is configured to join at least a portion of the first housing part and a portion of the second housing part that are overlapped on top of one another according to a direction perpendicular to the longitudinal axis wherein at least a portion of weld material is arranged on an outer side surface of the housing assembly. This is, at least a portion of the one or more sidewalls of the first housing part and a portion of the one or more sidewalls of the second housing part may be overlapped on top of one another according to a direction substantially perpendicular to the clamping pressure provided on the electronics carrier, with at least a portion of the weld material being arranged on an outer surface of the one or more sidewalls of the first housing part and/or on an outer surface of the one or more sidewalls of the second housing.

At least one of the first housing part and the second housing part may be electrically connected to the electronics carrier. For example, the first housing part may be electrically connected to the electronics carrier. Preferably, the first and second housing parts are electrically connected to each other. More preferably, the overlap welding comprises an electrically conductive material such as metal, for example, aluminum.

With the particular configuration described herein, an extremely lightweight electronic device is achieved whose complexity and costs are advantageously reduced. An important technical effect is that dissipation of heat generated by the electronic parts fitted within the housing assembly is highly improved. Furthermore, electromagnetism properties are also enhanced, particularly, when the first and housing parts are made of metal such as aluminum and, more in particular, when the electronics carrier is electrically connected to the first housing part and/or the second housing part, being the first and second housing parts electrically connected to each other. According to preferred examples, the first and second housing parts form an enclosure that acts as a Faraday Cage. Thus, in addition to ensuring optical communication between parts by sandwiching of the electronics carrier between housing parts and also the above-mentioned heat dissipation, electromagnetic compatibility (EMC) and electrostatic discharge (ESD) are also enhanced.

Sandwiching of the electronics carrier between and the first and second housing parts is performed along the longitudinal axis of the housing assembly. This is advantageous in the manufacturing process since no filler material is essential for performing the overlap welding. Advantageously, no gap is created in the longitudinal direction between the first and second housing parts which facilitates joining the parts by weld. In addition, overlap welding performed by laser welding, that is, with no filler material results in that one or more of the first housing part, the electronics carrier, and the second housing part can be arranged with direct contact with each other when in use. This greatly improves heat dissipation without increasing costs to the extent that the housing assembly is capable of suitably withstanding the heat generated by electronics components received within the housing assembly.

A method for assembling an electronic device as described above is also disclosed herein.

The method comprises placing the electronics carrier inside the housing assembly abutting at least one of the first housing part and the second housing part. The second housing part is mounted such that the electronics carrier is arranged sandwiched between the first housing part and the second housing part.

The electronics connecting mechanism may be provided for electrically connecting the first and second printed circuit boards to each other.

A laser beam is directed to a region of the first and second housing parts. The housing assembly and the laser beam are rotated relative to each other about the longitudinal axis. As a result, the laser beam forms an overlap welding along an interface surface defined in the first and second housing parts that are joined to each other.

BRIEF DESCRIPTION OF THE DRAWINGS

Non-limiting examples of the present electronic device will be described in the following, with reference to the appended drawings.

In the drawings:

FIG. 3 is a cross-sectional view of the example of the vehicle camera module shown in FIGS. 1 and 2;

FIG. 4 is an enlarged fragmentary cross-sectional view of the vehicle camera module shown in FIG. 3;

FIG. 5 is a cross-sectional view of a further example of the present vehicle camera module; and FIG. 6 is an enlarged fragmentary cross-sectional view of the example of the vehicle camera module shown in FIG. 5.

DETAILED DESCRIPTION

Figure 1:
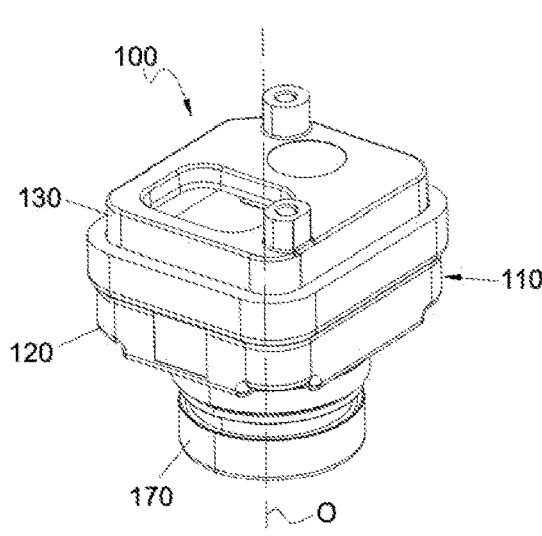
FIG. 1 is a general perspective view of one example of the present electronic device corresponding to a vehicle camera module.

With reference to the non-limiting examples shown in the figures of the drawings, a vehicle camera module 100 is described herein as well as a method for assembling thereof.

The vehicle camera module 100 shown in FIGS. 1-6 comprises a housing assembly 110 extending along a longitudinal axis O. In the examples of the figures, the longitudinal axis O corresponds to an optical axis of a camera lens assembly 170 that will be described further below.

The housing assembly 110 is made of an electrically conductive material such as aluminum. The housing assembly 110 comprises a first housing part or front housing 120 and a second housing part or back housing 130.

The vehicle camera module 100 includes an electronics carrier 140, a camera lens assembly 170, and an image sensor 150. The image sensor 150 is arranged in communication with the camera lens assembly 170. Furthermore, the image sensor 150 is coupled to the electronics carrier 140 so as to acquire a captured image. The camera lens assembly 170 extends along the longitudinal axis O. The longitudinal axis O defines an optical axis of the camera lens assembly 170.

The front housing 120 extends longitudinally from a first end to a second end according to the longitudinal axis O. Further, the front housing 120 comprises an outer surface, a bottom surface disposed at or near the second end, one or more sidewalls including an inner surface, and, in use, a space being formed in an interior of the front housing 120 when the front and back housing 120, 130 are joined to each other. The lens assembly 170 is at least partially disposed in the space formed in the interior of the front housing 120 at or near the first end.

The back housing 130 extends longitudinally from a first end to a second end according to the longitudinal axis O. Further, the back housing 130 comprises an outer surface, a front surface disposed at or near the first end, one or more sidewalls including an inner surface and, in use, a space being formed in an interior of the back housing 130 when the front and back housings 120, 130 are joined to each other.

The front housing 120 and the back housing 130 are electrically connected to each other and to the electronics carrier 140.

The electronics carrier 140 comprises a first printed circuit board 141 and a second printed circuit board 142. The first and second printed circuit boards 141, 142 are spaced apart along and substantially perpendicular to the longitudinal axis O. Both the first and second printed circuit boards 141, 142 are provided within an inner space that is defined when the front housing 120 and the back housing 130 are joined to each other.

In the non-limiting example shown in the figures of the drawings, illustrates the first and second printed circuit boards 141, 142, where the first printed circuit board 141 is tightly sandwiched in the inner space defined by the front and back housings 120, 130.

As shown in FIGS. 3 and 5, the first printed circuit board 141 has a first surface 141*a* and a spaced apart opposite second surface 141*b*. In the same way, the second printed circuit board 142 has a first surface 142*a* and a spaced apart opposite second surface 142*b*.

As shown in FIGS. 3-6, in use, the opposite surfaces 141*a*, 141*b* of the first printed circuit board 141 abut, that is, they are sandwiched through an interface fit, the front and back housings 120, 130, respectively. That is, in use, a portion 129 of the front housing 120 contacts a portion of a first surface 141*a* of the first printed circuit board 141 and a portion 139 of the back housing 130 contacts a portion of a second, opposite surface 141*b* of the first printed circuit board 141, as shown in FIGS. 3-6. It is preferred that contact portions between the portion 129 of the front housing 120 and the first surface 141*a* of the first printed circuit board 141 are aligned with each other. Likewise, is also preferred that contact portions between the portion 139 of the back housing 130 and the second surface 141*b* of the first printed circuit board 141 are aligned with each other.

Figure 2:
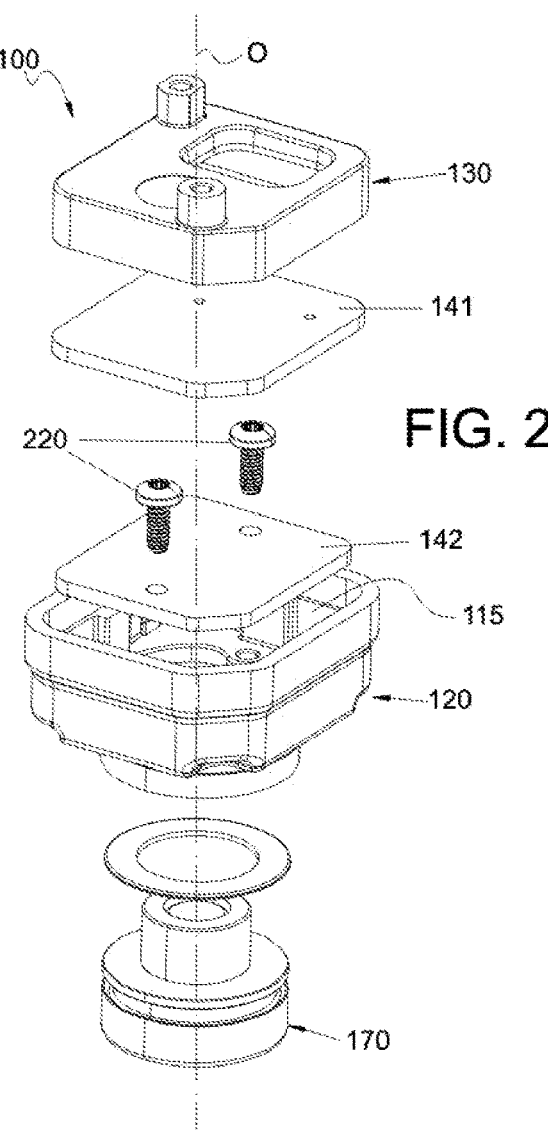
FIG. 2 is an exploded view of the example of the vehicle camera module shown in FIG. 1.

Also, in use, the first surface 142*a* of the second printed circuit board 142 abuts the front housing 120. The second printed circuit board 142 is attached to the front housing 120 through screws 220 as shown in FIGS. 2, 3 and 5. Alternatively, according to an example not shown, instead of attaching the second printed circuit board 142 to the front housing 120 through screws 220, the front housing 120 may contact a portion of the first surface 142*a* of the second printed circuit board 142 and the back housing 130 may contact a portion of the second, opposite surface 142*b* of the second printed circuit board 142.

In use, as shown in FIGS. 3-6, the first printed circuit board 141 is arranged further away from the lens assembly 170 than the second printed circuit board 142. Also, the second surface 141*b* of the first printed circuit board 141 is arranged further away from the lens assembly 170 than the first surface 141*a* of the first printed circuit board 141, as shown in FIGS. 3 and 5. In turn, the first surface 141*a* of the first printed circuit board 141 is arranged closer to the image sensor 150 than the second surface 141*b* of the first printed circuit board 141. In particular, the image sensor 150 is coupled to the first surface 142*a* of the second circuit board 142.

The opposite surfaces 141*a*, 141*b* of the first printed circuit board 141 could not be in direct contact with a portion 129 of the front housing 120 and a portion 139 of the back housing 130. For example, a deformable elastic mechanism comprising an elastic material or structure such as a metallic spring, a rubber gasket, or a paste-like gap filler, may be arranged on at least one of the front and back housings 120, 130 or on the first printed circuit board 141 (not shown). As a result, the above mentioned sandwiching effect is dampened by the elastic mechanism resulting in damages on the electronics carrier 140 due to overpressure being advantageously avoided or at least partially reduced.

An electronics connecting mechanism is provided that includes a board-to-board connector 160 for electrically connecting the first and second printed circuit boards 141, 142 to each other. The board-to-board connector 160 may contribute to the sandwiching effect of the first and second printed circuit boards 141, 142. Thus, the first and/or the second printed circuit boards 141, 142 may be sandwiched between the board-to-board connector 160 and at least one of the front and back housings 120, 130.

The present vehicle camera module 100 further includes an attaching mechanism 200 for joining the front and back housings 120, 130 to each other. The attaching mechanism 200 comprises an overlap welding 210. The overlap welding 210 defines welded areas in surfaces of the front and back housings 120, 130 that at least partly overlap each other. This is, the overlap welding 210 is configured to join at least a portion of the front housing 120 and a portion of the back housing 130 that are overlapped on top of one another according to a direction perpendicular to the longitudinal axis O. The overlap welding 210 may cause the front and back housings 120, 130 to be sealingly joined together. The overlap welding 210 is preferably performed by laser welding, with no filler material. Further, the overlap welding 210 is obtained by melting a portion of the front and back housings 120, 130. However, the overlap welding 210 may be alternatively performed by supplying a suitable filler material. The overlap welding 210 is contained in a plane P that is arranged substantially perpendicular to the longitudinal axis O of the housing assembly 110. This has been found to be advantageous to ensure that no gap is created in the longitudinal direction between the front and back housings 120, 130, that is along a direction parallel to the longitudinal axis O of the housing assembly 110 when manufacturing tolerances appear on at least one of a contact portion of the front housing 120, the thickness of the electronics carrier 140; and a contact portion of the back housing 130. This advantageously facilitates joining of the front and back housings 120, 130.

Within the meaning of the present disclosure, manufacturing tolerances refer to variations in measurements of an actual size with respect to a nominal size of at least one of the front housing 120 and the back housing 130. It is to be noted that when the manufacturing tolerances vary, a corresponding variation in the size of a side surface 125*b*, 126, 135, 136*b* of at least one of the front housing 120 and the back housing 130 is made in the manufacturing process. The variation in the size of the side surface 125*b*, 126, 135, 136*b* is preferably equal to or greater than the above mentioned manufacturing tolerance.

The inner surface 125 of the front housing 120 comprises a protrusion that extends along the direction of the longitudinal axis O or parallel thereto, or perpendicular to the first and second surfaces 141*a*, 141*b* of the first printed circuit board 141. The protrusion may comprise a contact portion that is, in particular, a thermal and/or electrical conductor. The contact portion, in use, abuts the first surface 141*a* of the first printed circuit board 141.

The inner surface 136 of the back housing 130 comprises a protrusion that extends along the direction of the longitudinal axis O or parallel thereto, or perpendicular to the first and second surfaces 141*a*, 141*b* of the first printed circuit board 141. The protrusion may comprise a contact portion that is, in particular, a thermal and/or electrical conductor. The contact portion, in use, abuts the second surface 141*b* of the first printed circuit board 141.

In use, each contact portion may provide a contact pressure applied to corresponding first and second surfaces 141*a*, 141*b* of the first printed circuit board 141. The contact pressure may provide a force component substantially perpendicular to the first or second surfaces 141*a*, 141*b* of the first printed circuit board 141. The contact portion may comprise the above-mentioned elastic mechanism. It is preferred that the front and back housings 120, 130 are configured to be joined to each other by the overlap welding, being the first printed circuit board 141 with an interference fit with the front and back housing 120, 130. For this purpose, the overlap welding 210 is adapted to keep the first printed circuit board tightly clamped in the direction parallel to the longitudinal axis O, or perpendicular to the first and second surfaces 141*a*, 141*b* of the first printed circuit board 141. The overlap welding 210 is configured to join at least a portion of the front housing 120 and a portion of the back housing 130 that are overlapped on top of one another according to a direction perpendicular to the longitudinal axis O. This is, at least a portion of the one or more sidewalls of the front housing 120 and a portion of the one or more sidewalls of the back housing 130 is overlapped on top of one another according to a direction substantially perpendicular to the clamping pressure provided on the first printed circuit board carrier 141. Further, at least a portion of the overlap welding 210 is arranged on an outer side surface 126 of the front housing 120 and/or on an outer side surface 135 of the back housing 130.

The housing assembly 110 of the vehicle camera module 100 described above can be assembled efficiently and quickly without screws being required for joining the front housing 120 and the back housing 130. Consequently, the one or more sidewalls of the front housing 120 and/or the back housing 130 are advantageously thinner. Therefore, a sidewall with a stepped portion to join the front and back housings 120, 130 may be avoided. Thus, the amount of material used, and thus overall weight is reduced such that a lighter camera assembly is achieved. Attachment of the front and back housings 120, 130 is carried out without adversely affecting good performance while ensuring good optical alignment of the camera lens assembly 170 and the image sensor 150.

In the examples shown, the overlap welding 210 is applied along an entire perimeter section of the front and back housings 120, 130 extending around the longitudinal axis O of the housing assembly 110.

FIG. 3, and more in detail FIG. 4, illustrate a first example of application of the overlap welding 210. In the first example of FIGS. 3 and 4, the overlap welding 210 is formed on an interface surface that is defined in the outer side surface 135 of the back housing 130, an end surface 125a of the front housing 120, and an inner side surface 125b of the front housing 120. The overlap welding 210 could be alternatively formed by an interface surface defined only in the outer side surface 135 of the back housing 130 and an inner side surface 125b of the front housing 120.

FIG. 5, and more in detail FIG. 6, illustrate a second example of application of the overlap welding 210. In the second example of FIGS. 5 and 6, the overlap welding 210 is formed on the outer side surface 126 of the front housing 120, an end surface 136a of the back housing 130, and an inner side surface 136b of the back housing 130. The overlap welding 210 could be alternatively formed by an interface surface defined only in an outer side surface 126 of the front housing 120 and an inner side surface 136b of the back housing 130.

The overlap welding 210 for joining the front housing 120 and the back housing 130 to each other according to the above examples prevents the electronics carrier 140 from being damaged while ensuring good performance in terms of improved heat dissipation and the above-mentioned optical alignment. As stated above, no gap is created in the longitudinal direction between the front and back housings 120, 130, that is, in the interface surface. This facilitates joining of the front and back housings 120, 130.

A gap may be present between the front and back housings 120, 130, defined between one or more of:

a distance from the outer side surface 135 of the back housing 130 to the end surface 125a and/or the inner side surface 125b of the front housing 120; and a distance from the outer side surface 126 of the front housing 120 to the end surface 136a and/or the inner side surface 136b of the back housing 130.

Thus, as stated above, when a gap is present between the front and back housings 120, 130, there is no direct contact there between at least in this area, that is, a direct contact between the front and back housings 120, 130 could exist in portions other than those corresponding to the gap. In this case, the overlap welding 210 is formed in the gap, completely filling it, in use. The interface surface is thus defined by the overlap welding 210.

For assembling the vehicle camera module 100, a housing assembly 110 comprising a front housing 120 and a back housing 120 is provided. The front housing 120 and the back housing 130 are disposed in contact with each other. An electronics carrier 140 comprising first and second printed circuit boards 141, 142 is also provided within an inner space 115 defined when the front housing 120 and the back housing 130 are joined together. In particular, the front and back housings 120, 130 are moved towards each other such that the first printed circuit board 141 is sandwiched between the front housing 120 and the back housing 130, preferably abutting at least one of the front housing 120 and the back housing 130. The second printed circuit board 142 is attached to the front housing 120 through screws 220 abutting a portion of the front housing 120. A board-to-board connector 160 is provided for electrically connecting the first and second printed circuit boards 141, 142 to each other. An image sensor 150 is attached to the first surface 142a of the second printed circuit board 142. An elastic mechanism is fitted to at least one of the front housing 120, the back housing 130, and the first printed circuit board 141.

Then, a laser beam is directed to a region of the front housing 120 and the back housing 130, in particular, to an interface surface there between. The housing assembly 110 and the laser beam are rotated relative to each other about the longitudinal axis O such that the laser beam forms an overlap welding 210 along the interface surface defined in the front and back housings 120, 130 when joined to each other. This results in the front housing 120 and the back housing 130 being joined together with the first and second printed circuit boards 141, 142 arranged there within.

Preferably, an adhesive is applied on the front housing 120 and/or the lens assembly 170. The lens assembly 170 and the front housing 120 are attached to each other such that the image sensor 150 is in optical communication to the lens assembly 170.

In particular, the method for assembling the vehicle camera module 100 comprises the steps of:

preferably, attaching the image sensor 150 to the first surface 142a of the second printed circuit board 142;

preferably, providing the electronics connecting mechanism 160 electrically connecting the first and second printed circuit boards 141, 142 to each other;

preferably, placing the second printed circuit board 142 inside the housing assembly 110 abutting a portion of the front housing 120;

preferably, mounting the elastic mechanism to at least one of the front housing 120, the back housing 130, and the first printed circuit board 141;

placing the first printed circuit board 141 inside the housing assembly 110 abutting at least one of the front housing 120 and the back housing 130;

approaching the front and back housings 120, 130 to each other such that the first printed circuit board 141 is arranged sandwiched between the front and back housings 120, 130;

directing a laser beam to a region of the front and back housings 120, 130;

rotating the housing assembly 110 and the laser beam relative to each other such that the laser beam forms an overlap welding 210 along an interface surface defined in the front and back housings 120, 130 that are joined to each other;

preferably, depositing adhesive mechanism on the front housing 120 and/or the lens assembly 170; and preferably, attaching the lens assembly 170 and the front housing 120 to each other such that the image sensor 150 is in optical communication to the lens assembly 170.

As stated above, the longitudinal axis O and the optical axis may coincide or be parallel to each other. The longitudinal axis O may optionally pass through a geometrical center of the vehicle camera module 100. Thus, rotating the housing assembly 110 and the laser beam relative to each other may be performed about the longitudinal axis O or the optical axis, to form the overlap welding 210.

Although only a number of examples of the present electronic device and assembly method thereof have been disclosed herein, other alternatives, modifications, uses and/ or equivalents thereof are possible. Furthermore, all possible combinations of the described examples are also covered. Thus, the scope of the present disclosure should not be limited by particular examples but should be determined only by a fair reading of the claims that follow. Reference signs related to drawings placed in parentheses in a claim are solely for attempting to increase the intelligibility of the claim and shall not be construed as limiting the scope of the claim.

What is claimed is:

1. A camera module comprising:
a housing assembly extending along a longitudinal axis and comprising a first housing part and a second housing part configured to be joined to each other;
an electronics carrier received within an inner space of the housing assembly defined when the first housing part and second housing part are joined to each other; and
an attaching mechanism comprising a weld joining at least a portion of the first housing part and a portion of the second housing part that are overlapped in a direction perpendicular to the longitudinal axis, wherein at least a portion of weld is arranged on an outer side surface of the second housing part and at least one of an end surface and an inner side surface of the second housing part, and wherein the electronics carrier is sandwiched between the first housing part and the second housing part.

2. The camera module of claim 1, wherein the overlap welding is at least partially positioned on a plane that is arranged substantially-perpendicular to the longitudinal axis.

3. The camera module of claim 1, wherein the overlap welding extends along an interface surface defined in the first housing part and second housing part when joined to each other.

4. The camera module of claim 3, wherein the interface surface is defined in at least one of an outer surface of the first housing part and an inner side surface or an end surface of the second housing part.

5. The camera module of claim 1, wherein the weld is provided in a gap defined:
between an inner side surface of the first housing part and an outer surface of the second housing part; or
between an inner side surface of the second housing part and an outer surface of the first housing part,
such that the first housing part and second housing part are joined together to form a seal between the first housing part and the second housing part.

6. The camera module of claim 1, wherein, in use, the electronics carrier is arranged sandwiched and positioned at least one of:
between the first housing part and the second housing part; or
between an electronics connector and at least one of the first housing part and second housing part.

7. The camera module of claim 6 further comprising a camera lens assembly extending along the longitudinal axis defining an optical axis and in communication with an image sensor coupled to the electronics carrier so as to acquire a captured image.

8. The camera module of claim 7, wherein the electronics carrier comprises a first printed circuit board and second printed circuit board spaced apart along the optical axis and electrically connected to each other, the image sensor being coupled to at least one of the first printed circuit board and second printed circuit board with the first housing part and second housing part abutting different portions of the first printed circuit board.

9. The camera module of claim 8, wherein, in use, the second printed circuit board is sandwiched between the first housing part and second housing part.

10. The camera module of claim 1, wherein the weld is formed by a laser weld including a filler material.

11. The camera module of claim 1, wherein the housing assembly is made of an electrically conductive material.

12. A method for assembling a camera module, the method comprising:
positioning an electronics carrier inside a housing assembly that abuts at least one of a first housing part and a second housing part;
mounting a second housing part such that the electronics carrier is sandwiched between the first housing part and second housing part;
directing a laser beam to a region including the first housing part and second housing part; and
rotating the housing assembly and the laser beam relative to each other about a longitudinal axis such that the laser beam forms a weld along an interface surface defined between the first housing part and second housing part that overlap relative to each other in a direction perpendicular to a longitudinal axis, wherein at least a portion of the weld being arranged on an outer surface of the housing assembly, and wherein the weld is formed along an interface surface where the first housing part and second housing part are joined to each other.

13. The method for assembling a camera module of claim 12 wherein the electronics carrier includes a first printed circuit board; a second printed circuit board; and an electronic connector; wherein the method for assembling a camera module further comprises:
connecting the first printed circuit board to the second printed circuit board with the electronic connector.

14. A camera module comprising:
a housing assembly extending along a longitudinal axis and comprising a first housing part and a second housing part configured to be joined to each other;
an electronics carrier received within an inner space of the housing assembly that is defined when the first housing part and second housing part are joined to each other; and
a weld on an outer side surface of the first housing part and an outer side surface of the second housing part and at least one of an end surface and an inner side surface of the first housing part; or an outer side surface of the first housing part and at least one of an end surface or an inner side surface of the second housing part, and wherein the electronics carrier is sandwiched between an electronic connector and at least one of the first housing part or the second housing part.

15. The camera module of claim 14, wherein the weld is provided in a gap defined:
between an inner side surface of the first housing part and an outer surface of the second housing part; or
between an inner side surface of the second housing part and an outer surface of the first housing part,
such that the first housing part and second housing part are joined together to form a seal between the first housing part and the second housing part.

16. The camera module of claim 14 further comprising a camera lens assembly extending along the longitudinal axis defining an optical axis and in communication with an image sensor coupled to the electronics carrier so as to acquire a captured image.

17. The camera module of claim 14, wherein the housing assembly is made of an electrically conductive material.

\* \* \* \* \*